(12) United States Patent
Ebinuma

(10) Patent No.: US 7,136,238 B2
(45) Date of Patent: Nov. 14, 2006

(54) METHOD OF SUPPORTING AND ADJUSTING OPTICAL ELEMENT IN EXPOSURE APPARATUS

(75) Inventor: Ryuichi Ebinuma, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 10/637,345

(22) Filed: Aug. 8, 2003

(65) Prior Publication Data

US 2004/0105177 A1    Jun. 3, 2004

(30) Foreign Application Priority Data

Aug. 9, 2002 (JP) .............................. 2002-232499

(51) Int. Cl.
*G02B 7/02* (2006.01)
(52) U.S. Cl. ...................................... 359/819; 359/871

(58) Field of Classification Search ................ 359/811, 359/818, 819, 822, 871, 872
See application file for complete search history.

(56) References Cited

U.S. PATENT DOCUMENTS

| 6,086,209 | A * | 7/2000 | Miyahara et al. | ........... 359/872 |
| 6,307,688 | B1 * | 10/2001 | Merz et al. | ................. 359/819 |
| 6,400,516 | B1 * | 6/2002 | Spinali | ....................... 359/819 |

* cited by examiner

*Primary Examiner*—Alessandro Amari
(74) *Attorney, Agent, or Firm*—Morgan & Finnegan, L.L.P.

(57) ABSTRACT

Disclosed is a supporting structure for supporting an optical element in an optical system, particularly for use in a semiconductor exposure apparatus. The supporting structure includes a first holding member having at least two supporting portions for supporting a peripheral portion of the optical system, and a second holding member for supporting the optical element, wherein the second holding member is connected to the first holding member, between the at least two supporting portions of the first holding member, through an elastic member.

5 Claims, 10 Drawing Sheets

METHOD OF SUPPORTING AND ADJUSTING OPTICAL ELEMENT IN EXPOSURE APPARATUS

FIELD OF THE INVENTION AND RELATED ART

This invention relates generally to a method of supporting and adjusting an optical element in an exposure apparatus. More particularly, the invention concerns a supporting structure for supporting an optical element, an optical system including such optical element supporting structure, an adjusting method, an exposure apparatus, and a device manufacturing method.

Semiconductor exposure apparatus is an apparatus for transferring an original (reticle) having a circuit pattern onto a substrate (silicon wafer). For the transfer, it uses a projection lens for imaging the pattern of the reticle upon the wafer. In order to produce a large density circuit, the projection lens must have a high resolving power. To this end, in projection lenses for semiconductor exposure apparatuses, aberrations should be well corrected and, for this reason, uniformness of various properties related to the glass material or films for the lens as well as machining precision of the glass surface shape and assembling precision must be above a predetermined level. Generally, a barrel for supporting glass lenses is made of metal, that is, a material different from the glass.

FIG. 2 is a sectional view of a portion of an optical system of a conventional semiconductor exposure apparatus, and it illustrates a basic structure of a barrel. In FIG. 2, a plurality of lenses 101 and 102 are held fixed by metal frames 103 and 104 for supporting the lenses. These metal frames are disposed in a vertical array within a cylindrical supporting member 105, and they are press-secured by pressing keeper screw rings 107 and 108, from the above.

In such barrel structure, the shape of a metal frame for supporting a lens should be considered. The shape of that portion of the metal frame which is to be contacted to the lens differs from the shape of the lens surface. This may cause deformation of the lens surface shape, and it may be a factor for deteriorating the performance of the optical system.

SUMMARY OF THE INVENTION

It is accordingly an object of the present invention to provide a method of supporting an optical element to be supported, by which surface distortion of the optical element attributable to a thermal expansion difference between the optical element and a supporting member for supporting the optical element or to assembling of the supporting member, can be removed.

It is another object of the present invention to provide a supporting structure according to such optical element supporting method, an optical system having such optical element supporting structure, an adjusting method for an optical system, an exposure apparatus and/or a device manufacturing method.

In accordance with an aspect of the present invention, to achieve at least one of these objects, there is provided a supporting structure for supporting an optical element, comprising: a first holding member having at least two supporting portions for supporting a peripheral portion of the optical system; and a second holding member for supporting the optical element, said second holding member being connected to said first holding member, between said at least two supporting portions of said first holding member, through an elastic member.

In one preferred form of this aspect of the present invention, the elastic member includes elastic force adjusting means for adjusting an elastic force of said elastic member.

The elastic force adjusting means may adjust the elastic force of said elastic member so that supporting forces of said first and second supporting members to the optical element are substantially balanced.

The elastic force adjusting means may be arranged to change the elastic force of said elastic member by changing the size of said elastic member.

The elastic member may comprise a helical spring.

The second holding member may include one first portion to be contacted to the optical element to support the same, and two second portions to be contacted to said first holding member, and the first and second portions of said second holding member may be disposed so that an action force of said elastic member acts in a plane of a triangle connecting the three portions.

The second holding member may include two first portions to be contacted to the optical element to support the same, and one second portion to be contacted to said first holding member, and the first and second portions of said second holding member may be disposed so that an action force of said elastic member acts in a plane of a triangle connecting the three portions.

The structure may include a plurality of second supporting members each being as aforesaid, and at least one second supporting member is disposed between adjacent supporting portions of said first supporting member, such that the supporting portions of said first supporting member and supporting portions of said second supporting member may be placed at a peripheral portion of the optical element alternately and approximately equidistantly.

The first holding member may have three supporting portions and said second supporting member may be disposed at a regular interval among the three supporting portions.

The optical element may be a mirror.

In accordance with another aspect of the present invention, there is provided an optical system, comprising: a plurality of optical elements; and a supporting structure as recited above.

In accordance with a further aspect of the present invention, there is provided a method of adjusting an optical system including a plurality of optical elements, said method comprising the steps of: supporting the plurality. of optical elements by use of a supporting structure as recited above; and adjusting an elastic force of the elastic member of the supporting structure to adjust aberration of the optical system.

In accordance with a yet further aspect of the present invention, there is provided an exposure apparatus, including an optical system as recited above, for transferring, by projection exposure, a pattern to a substrate to be exposed.

In accordance with a still further aspect of the present invention, there is provided an exposure method, comprising the steps of: transferring, by projection exposure, a pattern to a substrate to be exposed, by use of an optical system as recited above; and adjusting a transfer performance by adjusting an elastic force of the elastic member of the supporting structure.

In accordance with a still further aspect of the present invention, there is provided an exposure method, comprising the steps of: transferring, by projection exposure, a pattern to a substrate to be exposed, by use of an optical system as recited above; and adjusting an elastic force of the elastic member of the supporting structure, on the basis of hysteresis of exposure time.

In accordance with a yet further aspect of the present invention, there is provided an exposure method, comprising the steps of: transferring, by projection exposure, a pattern to a substrate to be exposed, by use of an optical system as recited above; and adjusting an elastic force of the elastic member of the supporting structure, on the basis of a result of evaluation made to a performance of the optical system.

In accordance with another aspect of the present invention, there is provided a device manufacturing method, comprising the steps of: exposing a substrate to be exposed, by use of an exposure apparatus as recited above; and developing the exposed substrate.

In accordance with a further aspect of the present invention, there is provided a supporting structure for supporting an optical element, comprising: a first holding member having one supporting portion for supporting a peripheral portion of the optical element; and at least two second holding members for supporting the optical element and being connected to said first holding member through an elastic member.

In accordance with a yet further aspect of the present invention, there is provided a supporting structure for supporting an optical element, comprising: a first holding member; and at least three second holding members for supporting the optical element and being connected to said first holding member through an elastic member.

In accordance with a still further aspect of the present invention, there is provided a supporting structure as recited just above, wherein said structure includes at least four second holding members, and wherein at least one of said at least four second holding members is associated with an elastic member having different elastic force.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
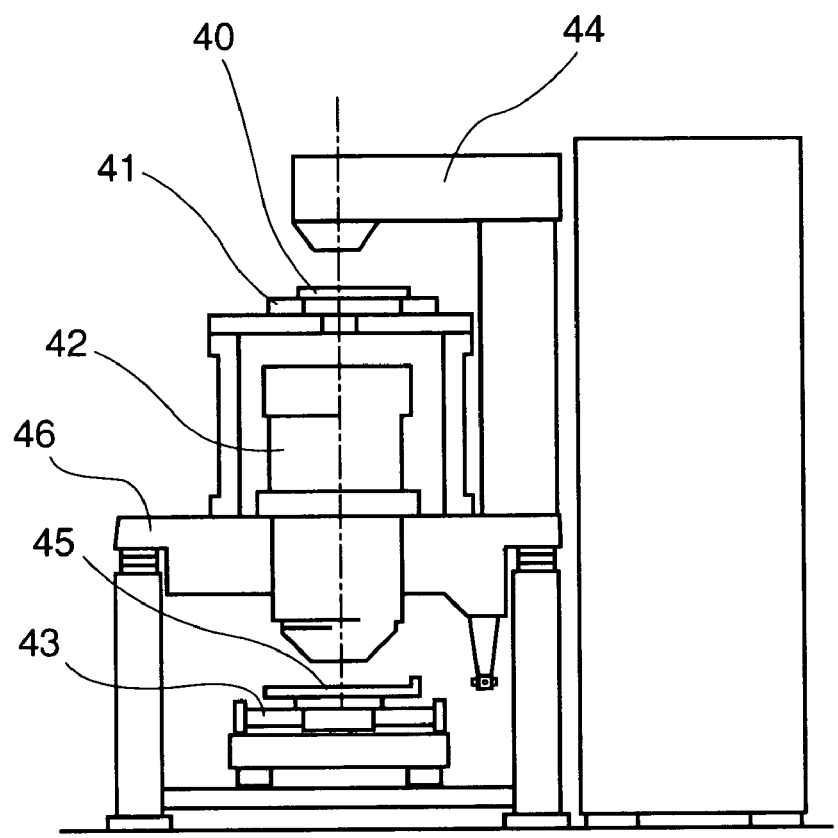
FIG. 1 is a schematic view of an exposure apparatus to which the present invention is applicable.
Figure 2:
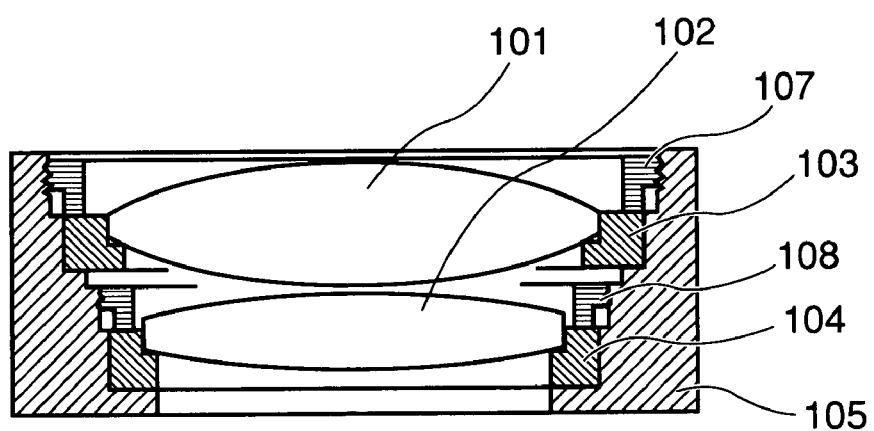
FIG. 2 is a sectional view of a conventional supporting structure.

When the structural features described above are applied, a high precision lens system can be accomplished. Also, where it is applied to a projection optical system of a semiconductor exposure apparatus, for example, an exposure process with little aberration can be accomplished, and a high-resolution transfer operation is attainable. This enables production of extraordinarily fine semiconductors.

More specifically, in relation to an optical element such as a lens used in an optical system, the optical element may be supported by means of (i) a first holding member having holding portions for holding two or more locations of the peripheral portion of the optical element, (ii) a second holding member having a portion to be contacted to the optical element and a portion to be contacted to the first holding member, and (iii) an elastic member for applying a force to the second holding member, relative to the first holding member. In this arrangement, the optical element is supported by the first and second holding members, but the optical element supporting force of the second holding member is provided by the elastic force of the elastic member. By controlling these supporting forces, any change in the surface shape of the optical element which is attributable to the optical element supporting force can be controlled.

An elastic member such as a metal helical spring, having a spring constant sufficiently smaller than the rigidity or stiffness to bending deformation of the optical element, may be used. By adjusting the length (displacement) of the elastic member, the balance between the supporting force of the second holding member to the optical element and the supporting force of the second holding member to the optical element can be changed easily. On the basis of it, the surface shape of the optical element can be changed as desired. Where such a structure is incorporated into an optical system, the adjustment of the elastic force of the elastic member can be used for adjustment in assembling the whole optical system and, thus, aberration of the whole optical system can be adjusted thereby.

The second holding member may have one portion to be contacted to the optical element, that is, the portion for applying a supporting force to the optical element, as well as two portions to be contacted to the first holding member, that is, the portions for transmitting a part of the optical element supporting force to the first holding member. This structure enables stable attitude of the second holding member as well as accurate setting of the optical element supporting force.

Alternatively, the second holding member may have two portions to be contacted to the optical element, that is, the portions for applying a supporting force to the optical element, as well as one portion to be contacted to the first holding member, that is, the portion for transmitting a part of the optical element supporting force to the first holding member. This structure enables stable attitude of the second holding member as well as accurate setting of the optical element supporting force.

The arrangement, in which the elastic force of the elastic member acts between the first and second holding members, enables that the whole structure can be provided in a single unit.

At the peripheral portion of the optical element, the supporting portions of the first and second holding members may be defined alternately. This makes it easier to design the structure that the position of the optical element is secured by means of the holding portions of the first holding member while deformation of the optical member is controlled by means of the holding portions of the second holding member. In that occasion, three supporting portions may be disposed with approximately equiangular distances, at the peripheral portion of the optical element. Additionally, the structure may include three second holding members, such that the optical element may be supported at six supporting positions by the first and second holding members. These six supporting positions may be disposed approximately equidistantly at the peripheral portion of the optical element, whereby deformation of the optical element in regard to three θ components can be controlled.

The optical element supporting structure may comprise an optical element supporting member including a plurality of first supporting members (supporting portions) for supporting the peripheral portion of an optical element, and a second holding member for supporting the optical element peripheral portion. The first holding members fixedly supports the optical element with respect to the optical element holding member, and the second holding member is adapted to change the shape of the optical element appropriately by adjusting the supporting force, for supporting the optical element, with respect to the optical element supporting member. Where an optical system having such optical element supporting means is incorporated into an exposure apparatus for transferring a pattern of an original to a photosensitive member, the shape of an optical element of the optical system can be changed into a desires shape best suited to the state of aberration of the optical system.

An optical unit such as described above may be incorporated into an exposure apparatus for transferring a pattern of an original onto a photosensitive substrate. Namely, where the above-described optical unit is incorporated into a projection optical system of an exposure apparatus and, by controlling the surface shape of the optical element, the image performance of the exposure apparatus can be controlled.

For adjustment of an optical system, a supporting structure for supporting at least one of optical elements, constituting the optical system, may comprise a first holding member having supporting portions for supporting at least two locations at the peripheral portion of the optical element and a second holding member having a portion to be contacted to the optical element and a portion to be contacted to the first holding member, as well as an elastic member for applying a force to the first and second holding members. By adjusting the elastic force of the elastic member, the surface shape of the lens can be controlled. By controlling the surface shape to a predetermined shape, aberration of the optical system can be adjusted.

Where an exposure method is to be provided, in an optical system of an exposure apparatus for transferring a pattern of an original onto a photosensitive substrate, the optical system adjusting method such as described above may be applied on the basis of the state of resolution performance of the exposure apparatus, having been expected in accordance with the hysteresis of exposure time, or on the basis of the state of resolution performance of the exposure apparatus, having been evaluated by use of evaluation means for evaluating the performance of the optical system of the exposure apparatus. By adjusting the resolution performance of the exposure apparatus, the transfer performance of the exposure apparatus can be adjusted.

Where the invention is applied to device production, the exposure apparatus or exposure method such as described above may be applied whereby circuit patters for semiconductor device or the like can be produced.

Preferred embodiments of the present invention will now be described with reference to the attached drawings.

[Embodiment 1]

FIG. 1 is a schematic view of a semiconductor exposure apparatus for manufacturing integrated circuits. In this exposure apparatus, exposure illumination light from an illumination optical system 44 is projected to a reticle 40 mounted on a reticle stage 41. The illumination light source may comprise light of ultraviolet region or vacuum ultraviolet region. The illumination region has a slit-like shape, and a portion of the pattern region of the reticle is illuminated thereby. The pattern corresponding to the slit portion is reduced by ¼ by a projection optical system 42, and it is projected upon a wafer 45 which is mounted on a wafer stage 43. The projection optical system 42 is mounted on a frame 46 of the exposure apparatus. By scanningly moving the reticle and the wafer synchronously relative to the projection optical system, the whole pattern region of the reticle is transferred to a photosensitive material applied to the wafer. The scanning exposure such as described above is repeated to plural transfer regions (shot regions) on the wafer.

Figure 3:
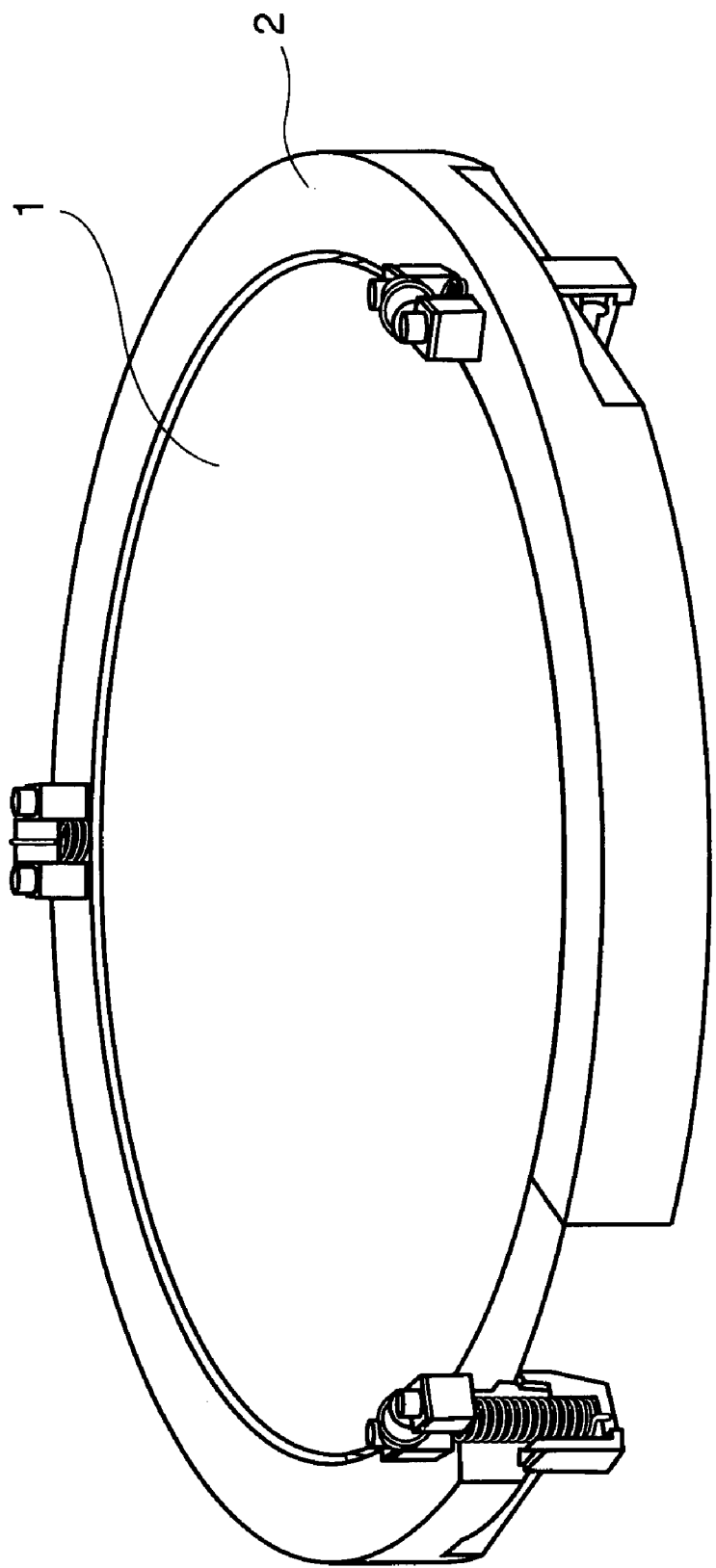
FIG. 3 is a perspective view, illustrating an optical element supporting structure in a first embodiment of the present invention.

FIG. 3 illustrates structural features of a supporting structure for an optical element in the projection optical system 42, according to the first embodiment. Denoted in FIG. 3 at 1 is a lens (optical element), and denoted at 2 is a first holding member for holding the lens. It has a ring-like shape, surrounding the lens. In FIG. 3, a portion of the first holding member 2 is removed, to show how the lens can be held.

In recent semiconductor exposure apparatuses, ultraviolet rays are used as a light source for exposure. Thus, quartz or fluorite is used as a glass material for the lenses, while metal or ceramics having sufficient rigidity and providing high machining precision are used as lens holding members.

Figure 4:
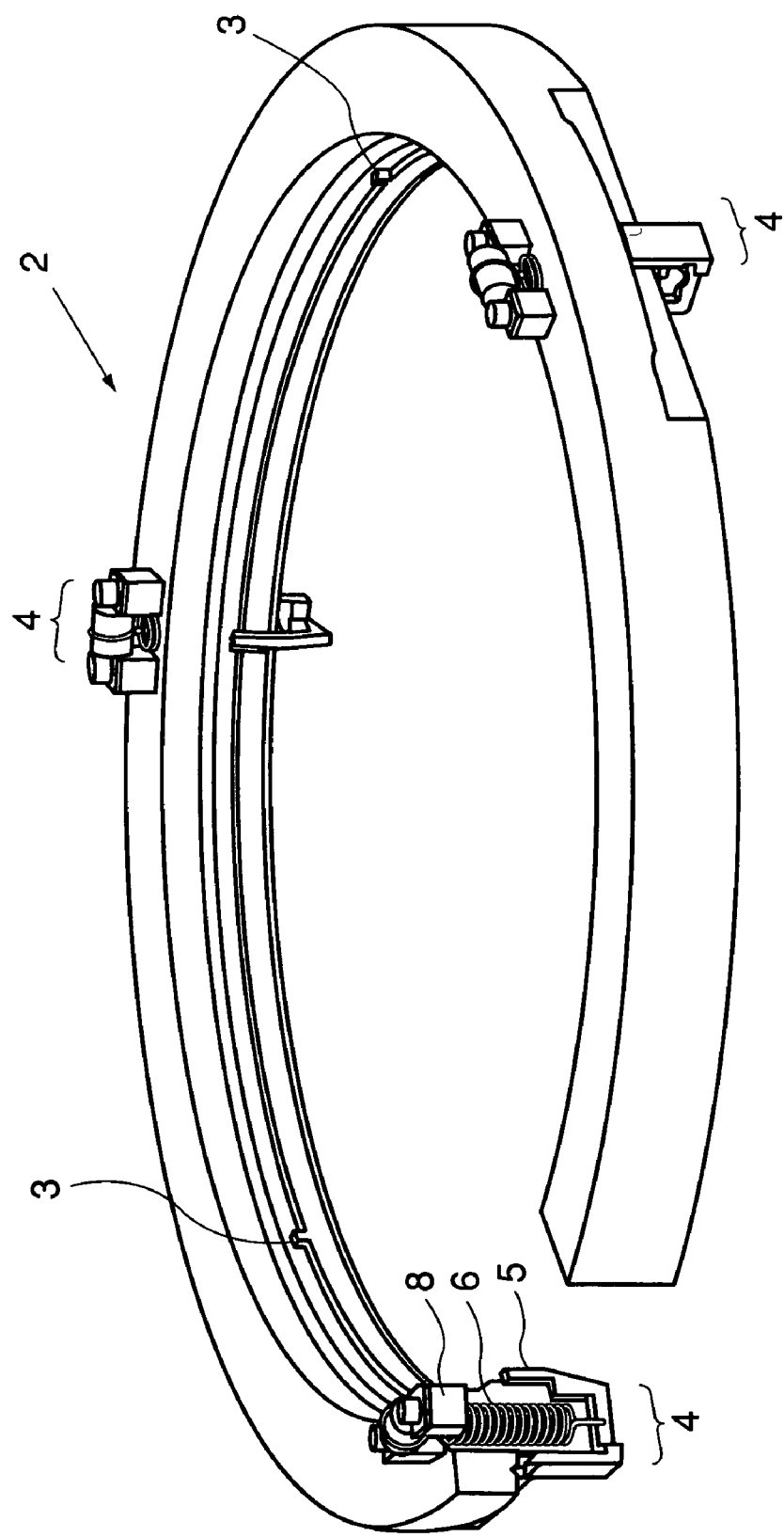
FIG. 4 is a perspective view, wherein a portion of a first holding member is cut to show the structural features.

FIG. 4 illustrates the structural features of the first holding member 2, while a portion thereof is removed. The first holding member 2 is formed with three seats 3 which are disposed at approximately 120° pitch. At these three locations, the lens can be supported fixedly. In FIG. 4, two of the three seats 3 are illustrated. There are holding portions 4 for controlling load deformation, each being placed at an intermediate position between two adjacent seats 3.

In this example, the structure has three seats and three holding portions (holding members based on a spring or resilient force) for controlling the load deformation. However, a structure with two seats and two holding portions for load deformation control may be used. Alternatively, four or more seats and holding portions may be used.

Figure 5:
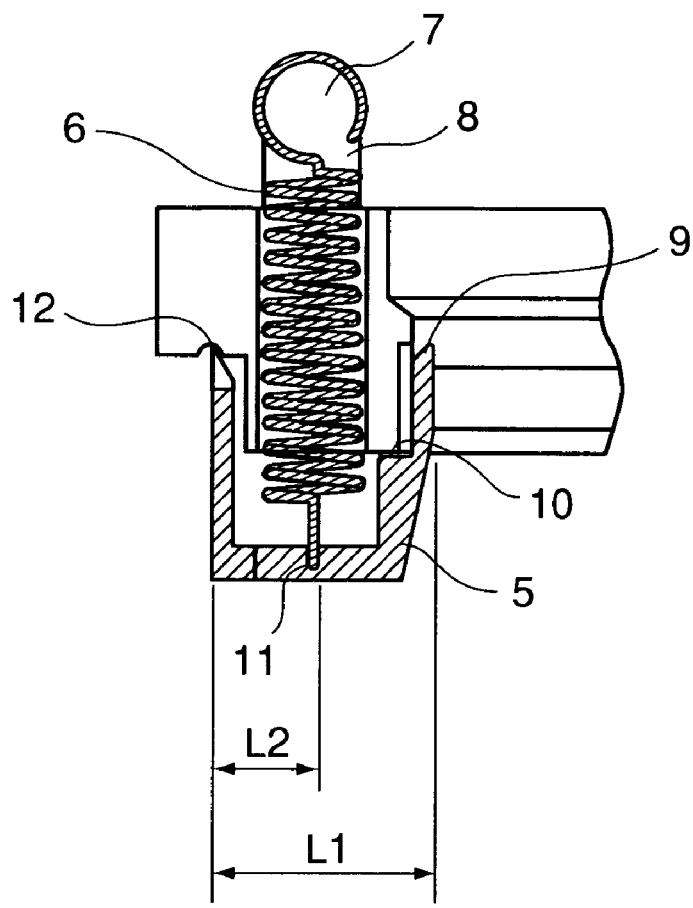
FIG. 5 is a sectional view of a holding portion for controlling load deformation, in the first embodiment of the present invention.

FIG. 5 is a sectional view, showing details of this portion. In FIG. 5, denoted at 5 is a second holding member for applying a force to the lens. Denoted at 6 is a metal spring which functions as a source of supporting force. The spring 6 comprises a tension coil spring, having an end connected to the first holding member 2 through a spring supporting member 7 and an adjusting member for adjusting elongation of the spring. The other end is connected to the second holding member 5. The second holding member 5 has a supporting portion 9 for supporting the lens with a predetermined force, a stopper portion 10, a connection portion being connected to the spring, and a portion 12 (contact portion with the first holding member 2) to be contacted to the first holding member 2 to receive action of a balancing force therefrom. Here, by changing the level (height) of the adjusting member 8, elongation of the spring, that is, the force applied to the second holding member 5 and, finally, the force to be applied to the lens 2 from the supporting portion 9, is adjusted.

As seen in FIG. 5, the stopper portion 10 is provided to stabilize the attitude of the second holding member 5 during the assemblage even if there is no lens. In order to assure that the force which the second holding member 5 receives from the spring 6 is stably received by the first holding member 2, the portion 12 receiving the action of balancing force and the stopper portion 10, which are provided at opposite sides of the spring contact portion 11, are brought into contact with the first holding member 2. As a lens is being mounted, the stopper portion 10 and the first holding member 2 are spaced from each other.

Figure 6:
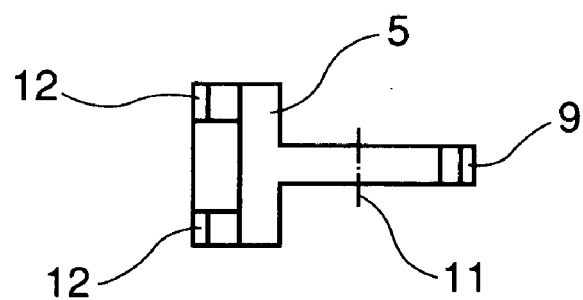
FIG. 6 is a schematic view of a second holding member, in the first embodiment of the present invention.

Further, for keeping the stability of attitude of the second holding member 5, there are provided two portions at two locations, for receiving the action of balancing force. More specifically, the structural portions are so arranged that, when a straight line is extended from the connection portion 11 between the spring and the second holding member 5, in the direction of the action force of the spring and toward a plane which is contained in a triangle defined by the lens supporting portion 9 (single location) and two locations of the balancing force action receiving portions 12 as seen in FIG. 6, the point of intersection between this straight line and the plane is defined inside the triangle formed by the lens supporting portion 9 and two locations of the balancing force action receiving portion 12.

Now, balance of force in an occasion where the optical axis of a projection optical system extends in registration with the direction of gravity force, will be explained. As regards the sign, a direction opposite to the gravity force is taken as positive. Where F is the tensile force of the spring, k is the spring constant, x is elongation of the spring, and T is the initial tensile force of the spring, then, there is the following relation:

$$F=T+k \cdot x$$

Further, where, as shown in FIG. 5, the distance of action of the second holding member 5 between the lens supporting portion 9 and the balancing force action receiving portion 12 (contact portion with the first holding member 2) is denoted by L1, the distance of action between the balancing force action receiving portion 12 and the spring contact portion 11 is L2, and the force for supporting the lens by the second holding member 5 is denoted by S, then there is the following relation:

$$S=F \cdot L2/L1$$

Accordingly, values T, k, x, L1 and L2 are designed so that S becomes equal to ⅙ of the lens weight. By setting the lens supporting force appropriately through adjustment of the thickness size of the adjusting member 8, the lens can be supported at six locations by even supporting forces.

Where the amount of adjustment of spring elongation is dx, the following relation applies to between it and the amount of change dS of the supporting force:

$$dS=k \cdot L2/L1 \cdot dx$$

On the other hand, in regard to the lens supporting force S at the position of the supporting portion 4, where displacement of the lens in the direction of S, resulting from a change in deflection (flexure) of the lens caused by a small change dS in the supporting force, is dv, the deflection rigidity K can be defined as follows:

$$K=dS/dv$$

From the above equations, the following relation is obtainable:

$$dv/dx=k \cdot L2/L2/K$$

As regards the spring constant, where a helical spring made of a spring steel material such as stainless is used, 0.4 N/mm or the like can be attained with a few-centimeter size.

On the other hand, as regards the rigidity K of the lens, although it depends on the shape or material used, in an example wherein a convex lens of quartz for use in an exposure apparatus and having a diameter of about 200 mm is used and supported at six locations, the rigidity K defined as described above will be approximately 20000 N/mm. Therefore, if dv/d1 is calculated while taking L2/L1 approximately equal to 0.5, the result would be 1/100000. This means that, if the spring elongation is adjusted with a resolution 0.1 mm, lens deformation of about 1 nm order can be controlled. In a reverse sense, even if the set precision for the elongation amount of the spring, constituting the holding portion 4, is about 0.1 mm, the influence of an error in the lens supporting force resulting therefrom, upon the lens self-weight deformation, would be only about 1 nm in terms of the flexed shape of the lens peripheral portion.

As described above, by designing the spring while paying a particular note to the large difference between the lens rigidity and the rigidity of the spring element, the necessity of extraordinarily strict precision control for the spring elongation amount can be removed. Without such exact control, but through easy adjustment of the spring elongation amount or appropriate control of the size of each constituent components which are influential to the spring elongation amount, the lens can be supported at six locations of the lens periphery with approximately even forces. Therefore, deformation at the lens peripheral portion due to the lens self-weight as well as deformation of the lens as s whole can be made very small.

What is essential in such lens supporting means having structure such as described above, is that: the position and attitude of the lens as a rigid material are secured by means of seats 3 at three locations and having large rigidity; and deformation of the lens as an elastic material is prevented by means of the holding portions 4 at three locations and having rigidities which are sufficiently smaller than that of the lens and which are approximately even. To assure this, a material such as metal or ceramics, being sufficiently stable as an elastic member, may be used. Additionally, a member that can be designed flexibly to make the spring constant small, such as being formed into a helical spring shape, may desirably be adopted.

In order that a force to be produced by a member of a shape such as a helical spring shape is applied to the peripheral portion of a lens, made of glass or crystal, in an exact direction as a supporting force, unnecessary friction force or elastic force should be eliminated. The second holding member 5 is specifically arranged to meet this. With this arrangement, at the lens holding portions 4, the resilient force produced by the helical spring is applied exactly and stably as the lens supporting force. By transmitting this supporting force to the first holding member 2, the whole lens supporting force can be well distributed to six locations uniformly.

[Embodiment 2]

Figure 7:
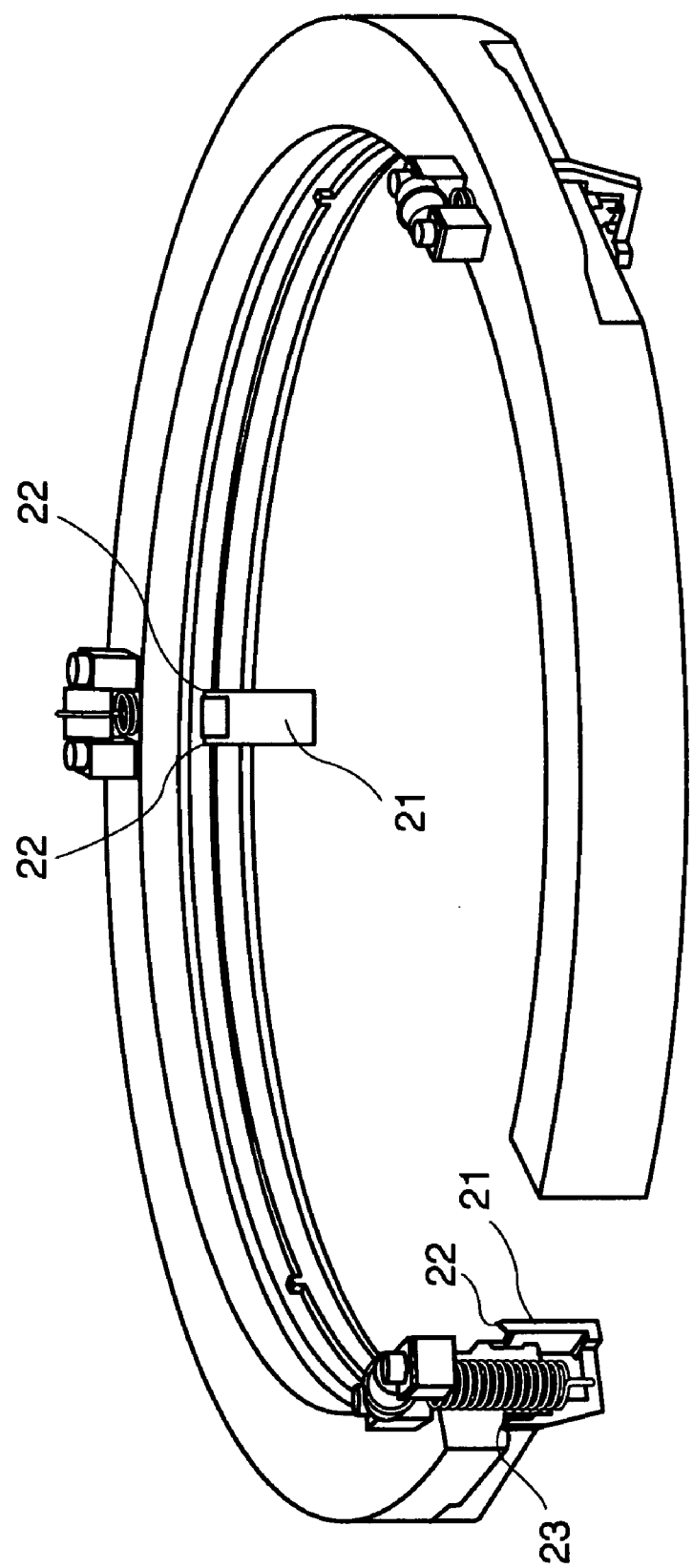
FIG. 7 is a perspective view of an optical element supporting structure according to a second embodiment of the present invention.

FIG. 7 illustrates the structural features of optical element supporting means according to a second embodiment of the present invention. This embodiment is a modified form of the holding portion for holding the lens in the first embodiment. More specifically, there are holding members 21 having a similar function as the second holding member 3 shown in FIG. 3. In FIG. 7, lens supporting portions 22 with which the lens is supported by the holding member 2 are provided at two locations. Also, there is a portion 23 for receiving the balancing force action is provided at a single location. The remaining portion of this embodiment is basically similar to that of the first embodiment.

The structural portions are so arranged that, when a straight line is extended from the connection portion 24 with the spring in the direction of the action force of the spring and toward a plane which is contained in a triangle defined by the lens supporting portions 22 (two locations) and the balancing force action receiving portion 23 at a single location, the point of intersection between this straight line and the plane is defined inside the triangle formed by the lens supporting portion 22 and two balancing force action receiving portion 23.

With this arrangement, the attitude of the holding member 21 can be made stable while the lens is being supported. Although the provision of the second holding member 5 and the holding member 21 having been described with reference to the first and second embodiments is an essential part of the present invention, effective shapes are possible in addition to the shapes shown in FIGS. 6 and 7. Namely, what is required in the present invention is that a component is provided by which three forces such as an elastic force of a spring, a self-weight force of the lens, and a reaction force from the operational portion provided in the lens supporting member, including a portion for fixedly supporting the lens, are balanced and applied.

[Embodiment 3]

Figure 8:
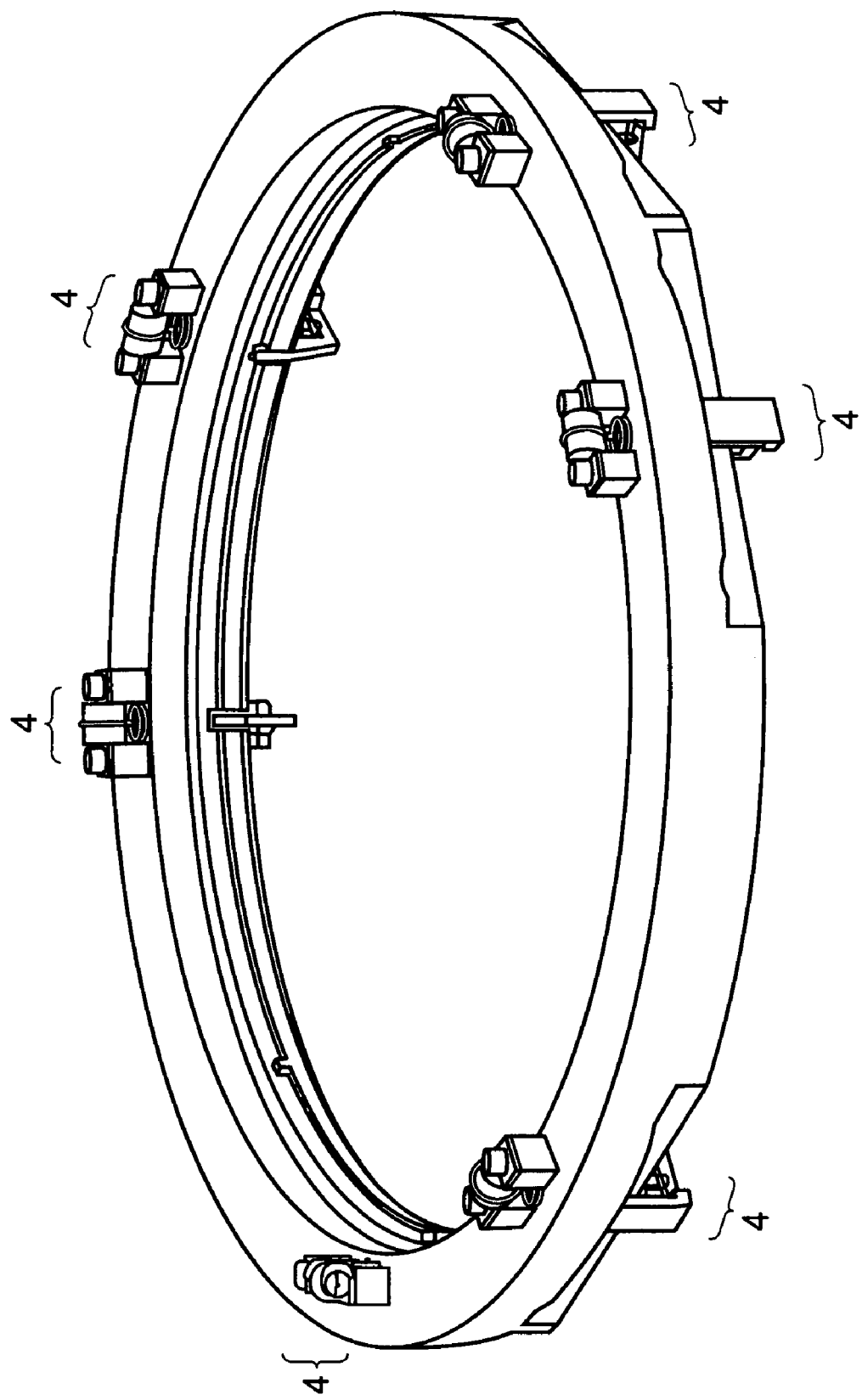
FIG. 8 is a perspective view of an optical element supporting structure according to a third embodiment of the present invention.
Figure 9:
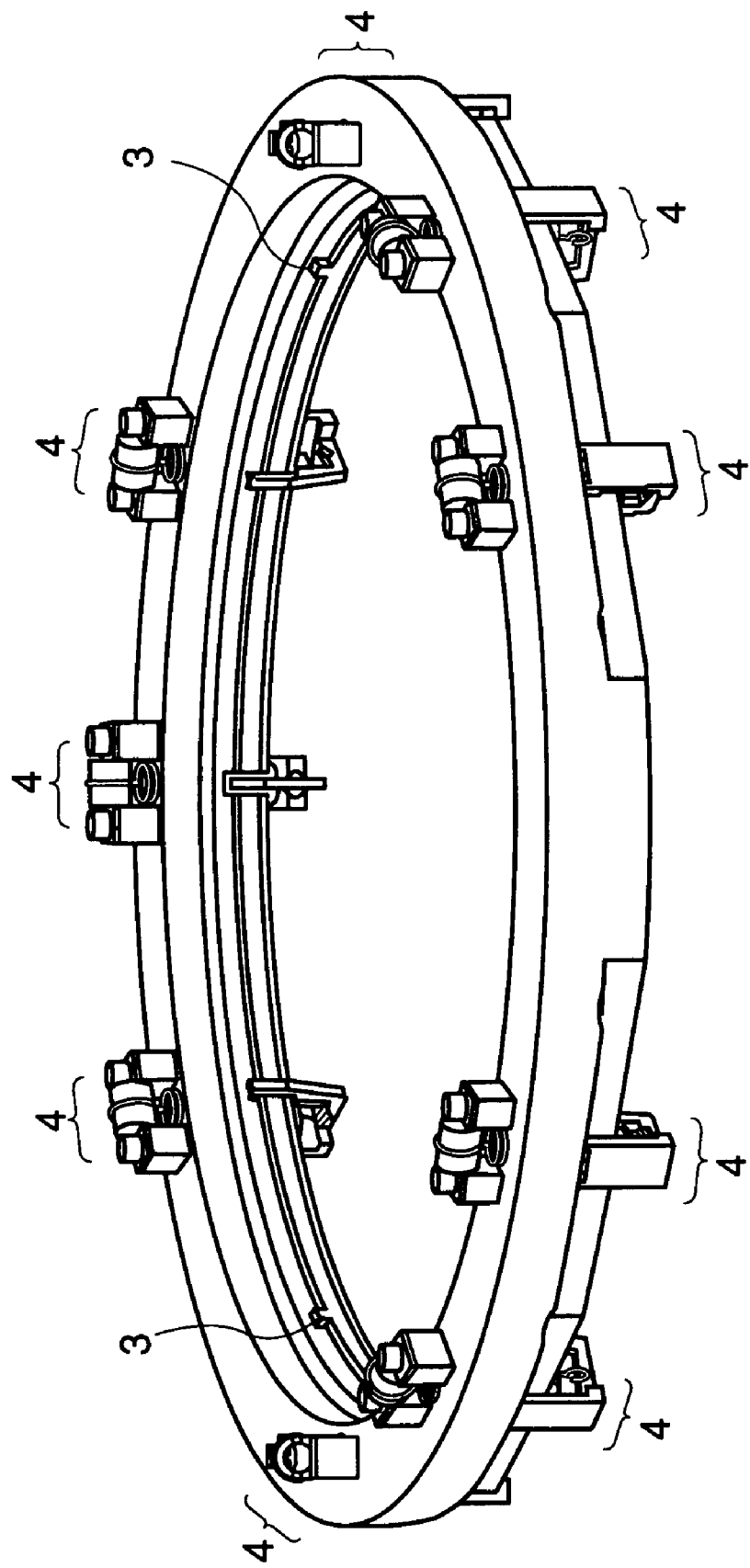
FIG. 9 is similar to FIG. 8, and it illustrates an optical element supporting structure according to the second embodiment of the present invention.

FIGS. 8 and 9 illustrate the structural features of optical element supporting means according to a third embodiment of the present invention, and it concerns a modified form of the lens supporting portion having been described with reference to the first and second embodiments. In the embodiment of FIG. 8, there are three seats for fixedly supporting a lens, at three locations defined by 120° pitch. Also, there are total six holding portions 4 between the seats, having spring means as described with reference to the first and second embodiments. Thus, the lens peripheral portion is supported at total nine locations, in this example. These supporting portions at nine locations are disposed along the lens periphery, at regular-pitch angles. The supporting force of each holding portion 4 can be set to be equal to ⅑ of the weight of the lens, by adjusting the elongation of the spring.

In the embodiment of FIG. 9, on the other hand, supporting portions 4 having a spring are provided at nine locations while fixedly holding portions 3 are provided at three locations. Thus, the lens is supported at total twelve locations, in this example. These twelve supporting portions are disposed along the lens periphery, at regular-pitch angles. In this example, the supporting force of the holding portion 4 is set to be equal to ½ of the weight of the lens. In both of the embodiments shown in FIGS. 8 and 9, the number of locations for supporting the lens periphery is larger than the first embodiment (six locations), and accordingly the flexure deformation at the lens peripheral portion is smaller. Thus, higher precision lens support is possible.

Here, the seat may be provided at a single location while plural holding portions with springs may be used, to support a lens. Alternatively, any seat is not used but three or more holding portions with springs may be provided to support a lens. If a lens is supported only by use of holding portions having springs, preferably four or more supporting portions and, more desirably, six or more supporting portions should be provided.

[Embodiment 4]

Figure 10:
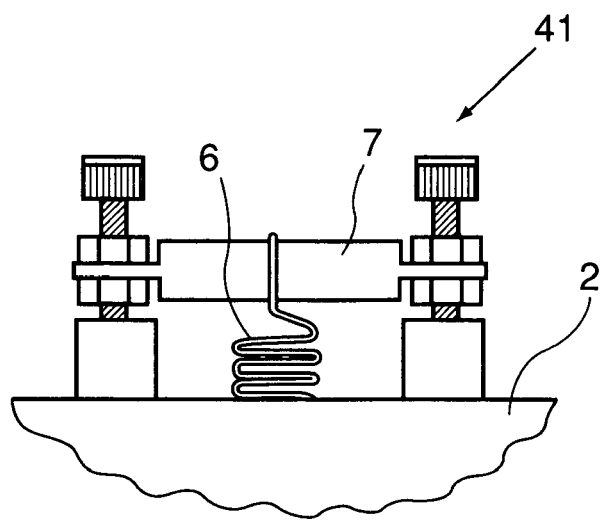
FIG. 10 is a schematic view of an elastic force adjusting mechanism for adjusting an elastic force of an elastic member, in a fourth embodiment of the present invention.

FIG. 10 illustrates the structural features of an elastic force adjusting mechanism for adjusting the elastic force of an elastic member, in a fourth embodiment of the present invention. In FIG. 10, denoted at 41 is a mechanism for adjusting elongation of a spring, and it functions to adjust the amount of spring elongation by adjusting the position of a spring supporting member 7, for supporting an upper end portion of a spring 6, with use of a screw and a nut. Although this embodiment uses an adjusting mechanism based on a screw and a nut, as a mechanism for adjusting the position, a structure for sandwiching an adjusting member such as that of the first embodiment may be used and the thickness of the adjusting member may be chosen. Alternatively, the adjusting member may be provided by two wedge members so that the thickness of the adjusting member can be adjusted by these wedge members.

The first embodiment has been described with reference to an example wherein the amount of this adjustment is set so that, at respective supporting positions, the lens supporting forces become even. However, this adjusting function may be utilized specifically for modification or correction in the lens system. For example, after the lens surface shape is observed, a deformation force to be applied to the peripheral portion of the lens as required to obtain a desired lens surface shape may be calculated. Then, the spring elongation amount may be adjusted to provide corresponding lens supporting forces. A desired surface shape can be accomplished thereby.

Further, the spring elongation may be adjusted while directly observing the lens surface shape. A desired surface shape can be accomplished thereby. For example, the lens supporting positions at three locations may be held fixed, and adjusting portions may be defined at three locations each being between adjacent fixed supporting positions. In such structure, by applying the same amount of adjustment at the three adjusting positions, respectively, three θ components of the lens surface shape can be adjusted.

Furthermore, the lens supporting structure of FIG. 10 may be applied to an appropriate lens or lenses in a lens system such as an imaging optical system having a plurality of lenses. By adjusting the spring elongation and through evaluation of the performance or aberration amount of the lens system, the lens supporting may be adjusted to provide best performance of the lens system or appropriate aberration of it. For example, the lens surface shape may be changed to adjust three θ component of the wavefront of aberration, or field distortion (distortion).

[Embodiment 5]

Figure 11:
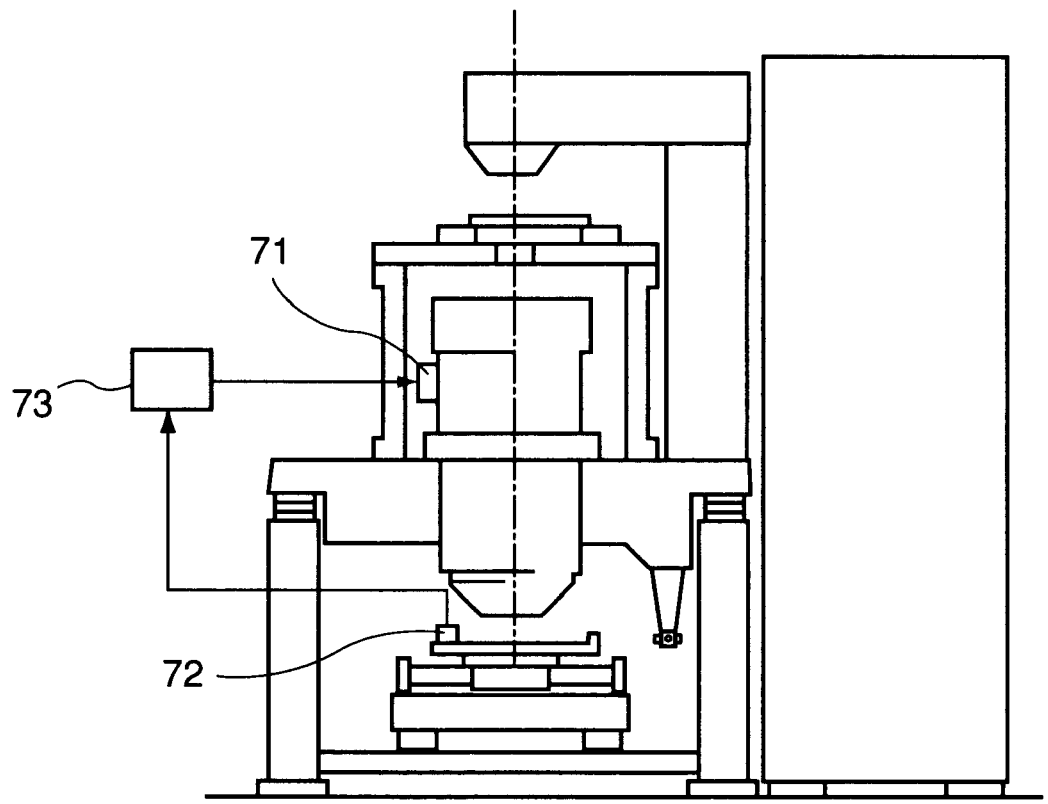
FIG. 11 is a schematic view of a semiconductor exposure system according to a fifth embodiment of the present invention.

FIG. 11 is a schematic view of a semiconductor exposure system according to a fifth embodiment of the present invention. In this embodiment, the exposure system is provided with an exposure optical system having a lens system in which lens supporting means described with reference to the preceding embodiments is incorporated. In the example of lens supporting structure described hereinbefore, for each lens the supporting force of a portion of the lens supporting force is adjusted to adjust the aberration. In this embodiment, the lens system is provided with driving means 71 such that the adjustment can be done by actuator drive.

On the other hand, the exposure apparatus is provided with means 72 for expecting a change in aberration of the exposure optical system. This means may comprise means for directly measuring aberration of the exposure optical system or, alternatively, it may be means for indirectly obtaining information such as temperature information of the exposure optical system, for example. Such information may be supplied to a computer 73 to calculate a value necessary for obtaining a driving amount for the driving means in the lens system, in regard to the position, attitude and deformation or the like of the lenses.

The computer 73 supplies appropriate driving signals to respective correcting means in the optical system, including those having been described hereinbefore, thereby to correct the optical system so as to reduce the aberration. With these adjustments, best transfer performance of the exposure apparatus can be maintained.

While in the foregoing the invention has been described with reference a projection lens system in a semiconductor exposure apparatus, the optical element may be a mirror, other than a lens. Further, the invention is applicable also to an optical element wherein deformation should be considered, such as an optical element based on diffraction, for example. The invention is applicable to various optical systems having a high precision optical system.

[Embodiment 6]

Next, referring to FIGS. 12 and 13, an embodiment of a device manufacturing method which uses an exposure apparatus based on the fifth embodiment described above, will be explained.

Figure 12:
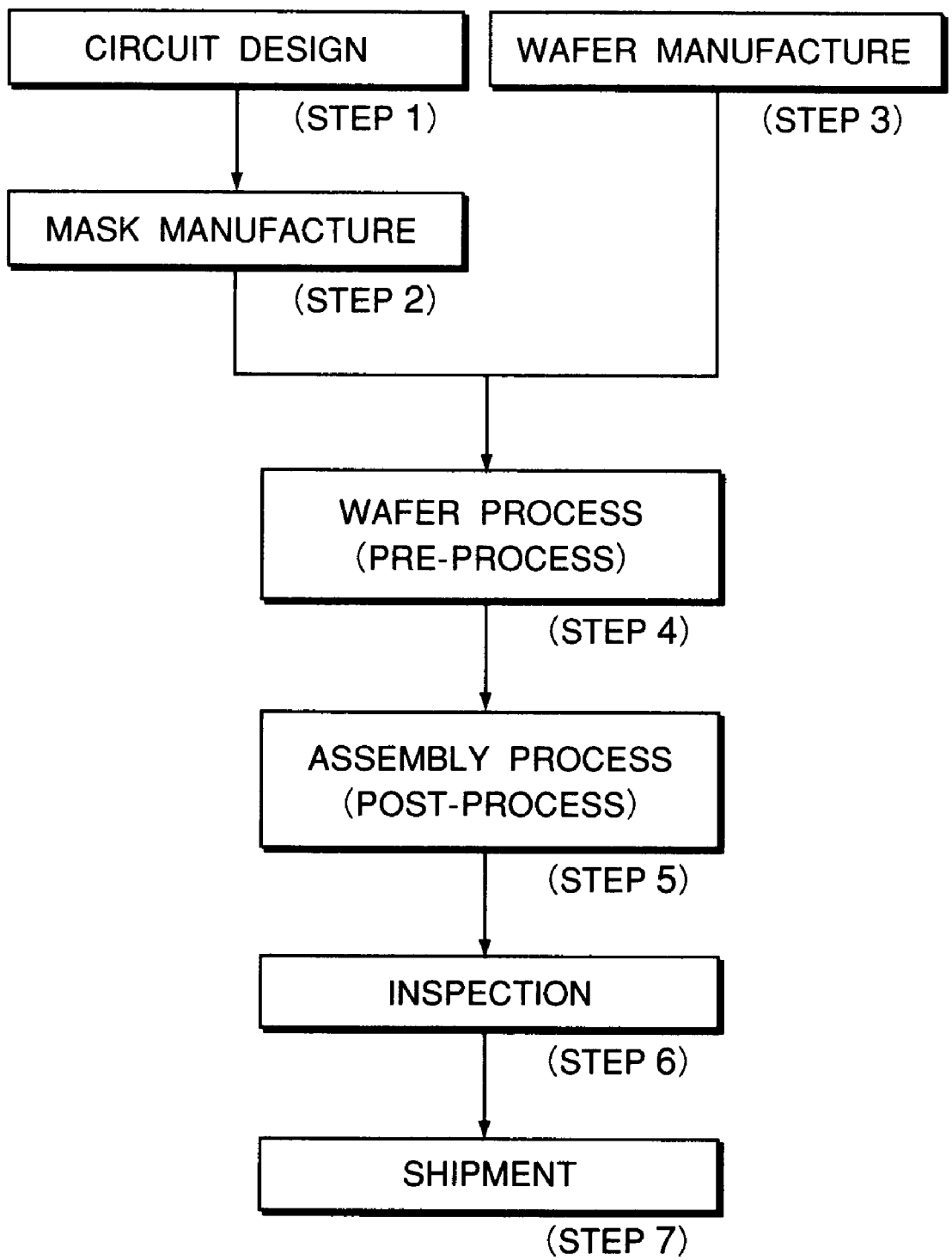
FIG. 12 is a flow chart of manufacturing processes for a device such as semiconductor chip (IC or LSI), LCD, or CCD, for example.

FIG. 12 is a flow chart for explaining the procedure of manufacturing various microdevices such as semiconductor chips (e.g., ICs or LSIs), liquid crystal panels, or CCDs, for example. In this embodiment, description will be made on an example of semiconductor chip manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 13:
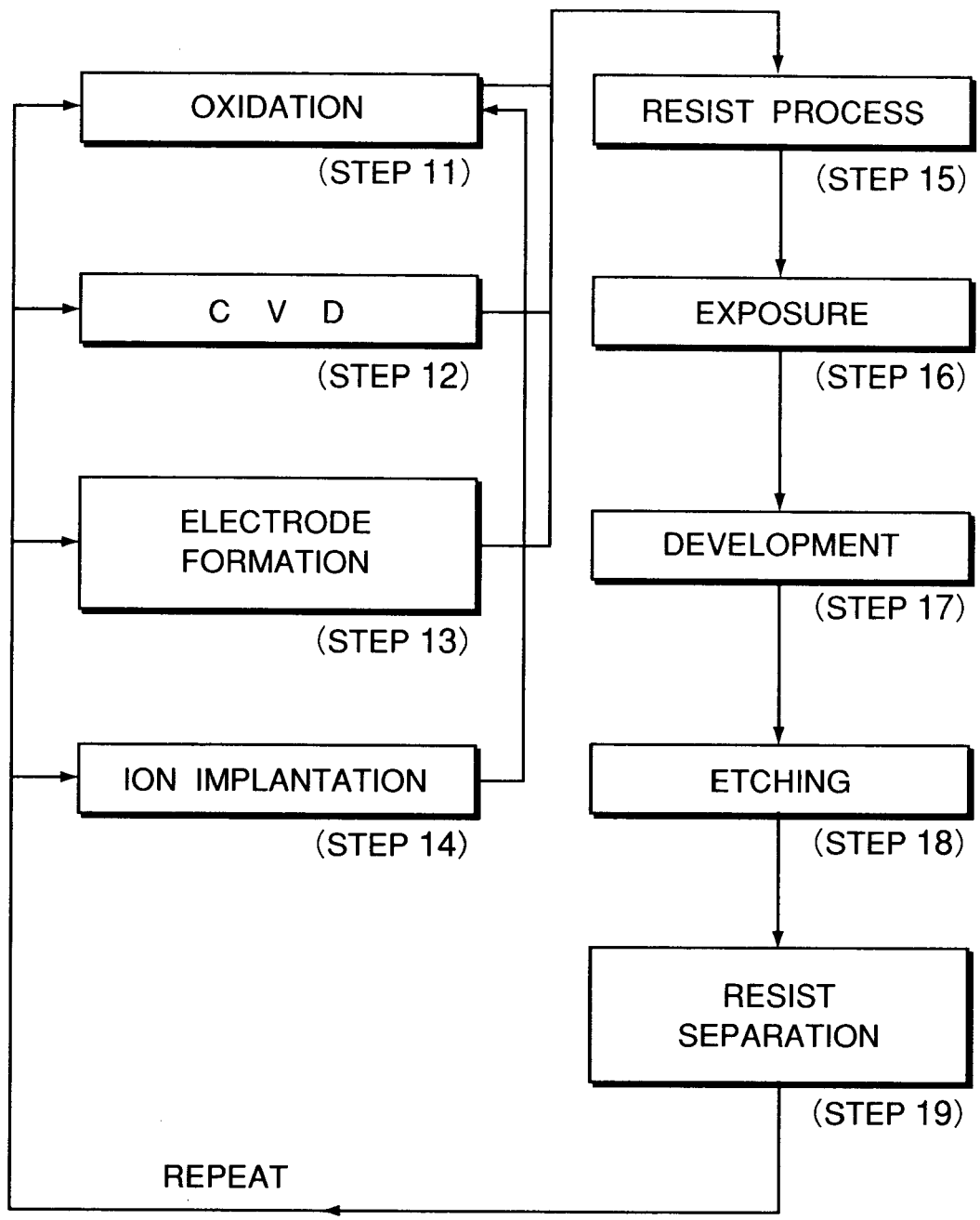
FIG. 13 is a flow chart for explaining details of a wafer process at step 4 in FIG. 12.

FIG. 13 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, higher quality microdevices can be manufactured. Thus, a device manufacturing method using an exposure apparatus such as described hereinbefore, and a device obtainable as a resultant are within the scope of the present invention.

In accordance with the embodiments of the present invention described hereinbefore, a supporting structure for an optical element by which, when the optical element is supported, distortion in shape of the optical element attributable to a difference in thermal expansion between the optical element and a supporting member for supporting the same or to the assembling of the optical element, can be prevented effectively. Also, an optical system having such optical element supporting structure, a method of adjusting an optical system, an exposure apparatus, an exposure method and a device manufacturing method, can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. A supporting structure for supporting an optical element, comprising:
    a first holding member having at least two supporting portions each supporting a first peripheral portion of the optical element;
    a second holding member, connected to said first holding member through an elastic member, having a supporting portion that supports a second peripheral portion of the optical element,
    wherein the supporting portion of said second holding member applies an elastic force provided by the elastic member to the optical element, and
    wherein the elastic force controls a surface deformation of the optical element caused by the at least two supporting portions of said first holding member.

2. A supporting structure for supporting an optical element, comprising:
    a first holding member having at least two supporting portions each supporting a first peripheral portion of the optical element;
    a second holding member, connected to said first holding member through an elastic member, having a supporting portion that supports a second peripheral portion of the optical element,
    wherein the supporting portion of said second holding member applies an elastic force provided by the elastic member to the optical element,
    wherein said elastic member includes elastic force adjusting means for adjusting an elastic force of said elastic member, and wherein said elastic force adjusting means is arranged to change the elastic force of said elastic member by changing a size of said elastic member.

3. A supporting structure for supporting an optical element, comprising:
   a first holding member having at least two supporting portions each supporting a first peripheral portion of the optical element;
   a second holding member, connected to said first holding member through an elastic member, having a supporting portion that supports a second peripheral portion of the optical element,
   wherein the supporting portion of said second holding member applies an elastic force provided by the elastic member to the optical element,
   wherein said second holding member has one supporting portion and two contact portions to be contacted to said first holding member, and
   wherein the supporting portion and the contact portions are disposed so that an action force of said elastic member acts in a plane of a triangle connecting the three portions.

4. A supporting structure for supporting an optical element, comprising:
   a first holding member having at least two supporting portions each supporting a first peripheral portion of the optical element;
   a second holding member, connected to said first holding member through an elastic member, having a supporting portion that supports a second peripheral portion of the optical element,
   wherein the supporting portion of said second holding member applies an elastic force provided by the elastic member to the optical element,
   wherein said second holding member each has two supporting portions and one contact portion to be contacted to said first holding member, and
   wherein the supporting portions and the contact portion are disposed so that an action force of said elastic member acts in a plane of a triangle connecting the three portions.

5. A supporting structure for supporting an optical element, comprising:
   a first holding member having at least two supporting portions each supporting a first peripheral portion of the optical element;
   a second holding member, connected to said first holding member through an elastic member, having a supporting portion that supports a second peripheral portion of the optical element,
   wherein the supporting portion of said second holding member applies an elastic force provided by the elastic member to the optical element,
   wherein said structure includes at least four second holding members, and
   wherein at least one of said at least four second holding members is associated with an elastic member having different elastic force.

* * * * *